United States Patent [19]

Otten

[11] 4,201,907
[45] May 6, 1980

[54] TOTALIZER SYSTEM

[75] Inventor: David M. Otten, Newton, Mass.

[73] Assignee: International Totalizing Systems, Inc., Newton, Mass.

[21] Appl. No.: 828,675

[22] Filed: Aug. 29, 1977

[51] Int. Cl.$^2$ .......................... G06M 3/06; G07C 3/10
[52] U.S. Cl. .......................... 235/92 AC; 235/92 FP; 235/92 V; 340/151; 455/613
[58] Field of Search .......... 235/92 AC, 92 FP, 92 V, 235/92 FL, 92 CN; 194/1 R, 1 N, 4 R; 250/199; 346/14 R, 14 MR; 340/151

[56] References Cited

U.S. PATENT DOCUMENTS

| | | | |
|---|---|---|---|
| 3,461,384 | 8/1969 | Bayati et al. | 250/199 |
| 3,946,219 | 3/1976 | Lucas | 235/92 FP |
| 4,005,409 | 1/1977 | Feuer | 235/92 FP |
| 4,038,525 | 7/1977 | Freeman | 235/92 CN |
| 4,119,948 | 10/1978 | Ward et al. | 340/151 |
| 4,132,981 | 1/1979 | White | 340/151 |

*Primary Examiner*—Joseph M. Thesz
*Attorney, Agent, or Firm*—Donald Brown

[57] ABSTRACT

A totalizer system having a first electronic device coupled to the vending machine for storing the number of vends (data) made by the vending machine, and a second device for interrogating the first device and providing a readout of said vends, e.g., in code, actual money value, or actual number of vends, or any form desired. The present system preferably includes an optical interrogation scheme using modulated light for transmitting stored vends in the first device to the second device thus eliminating human error, and an electronic memory in the first device that will store vends for a prolonged period of time even if the vending machine is unplugged.

9 Claims, 6 Drawing Figures

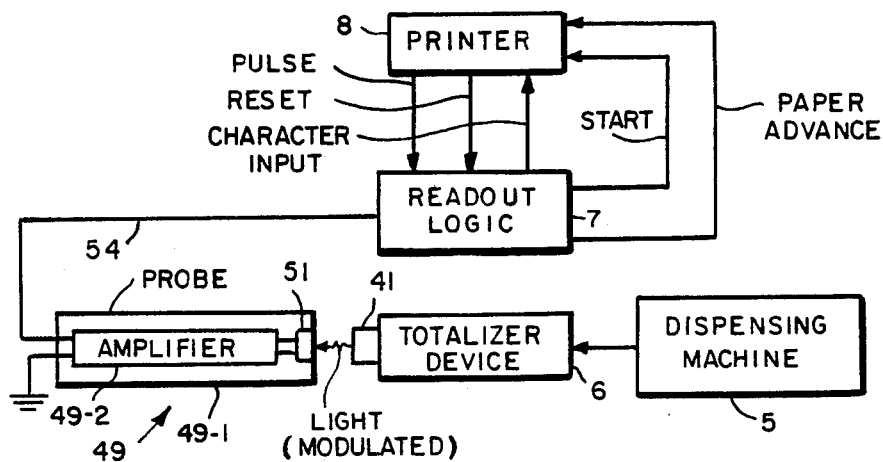
FIG. 1
FIG. 3A
FIG. 3B

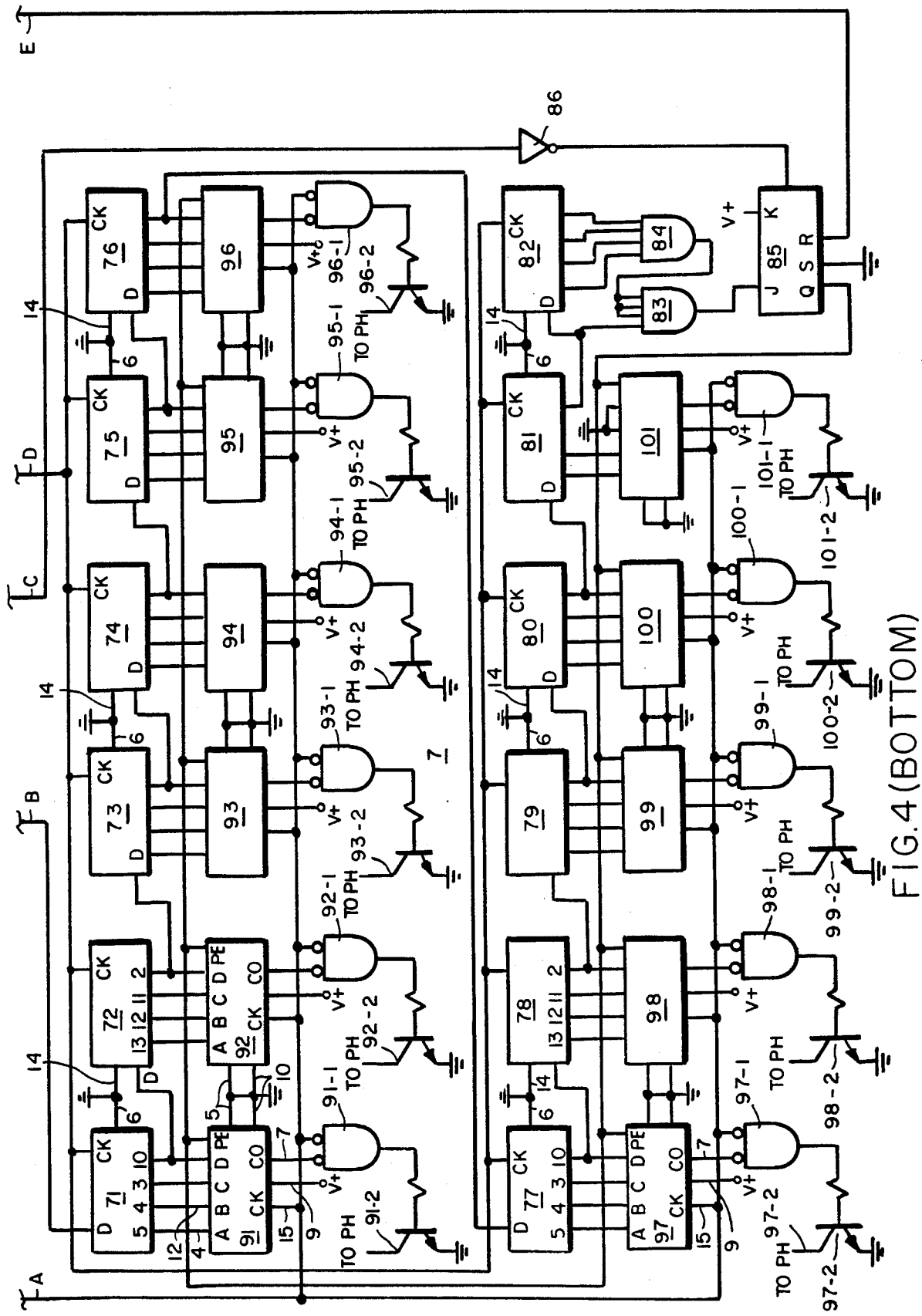
FIG. 4 (BOTTOM)

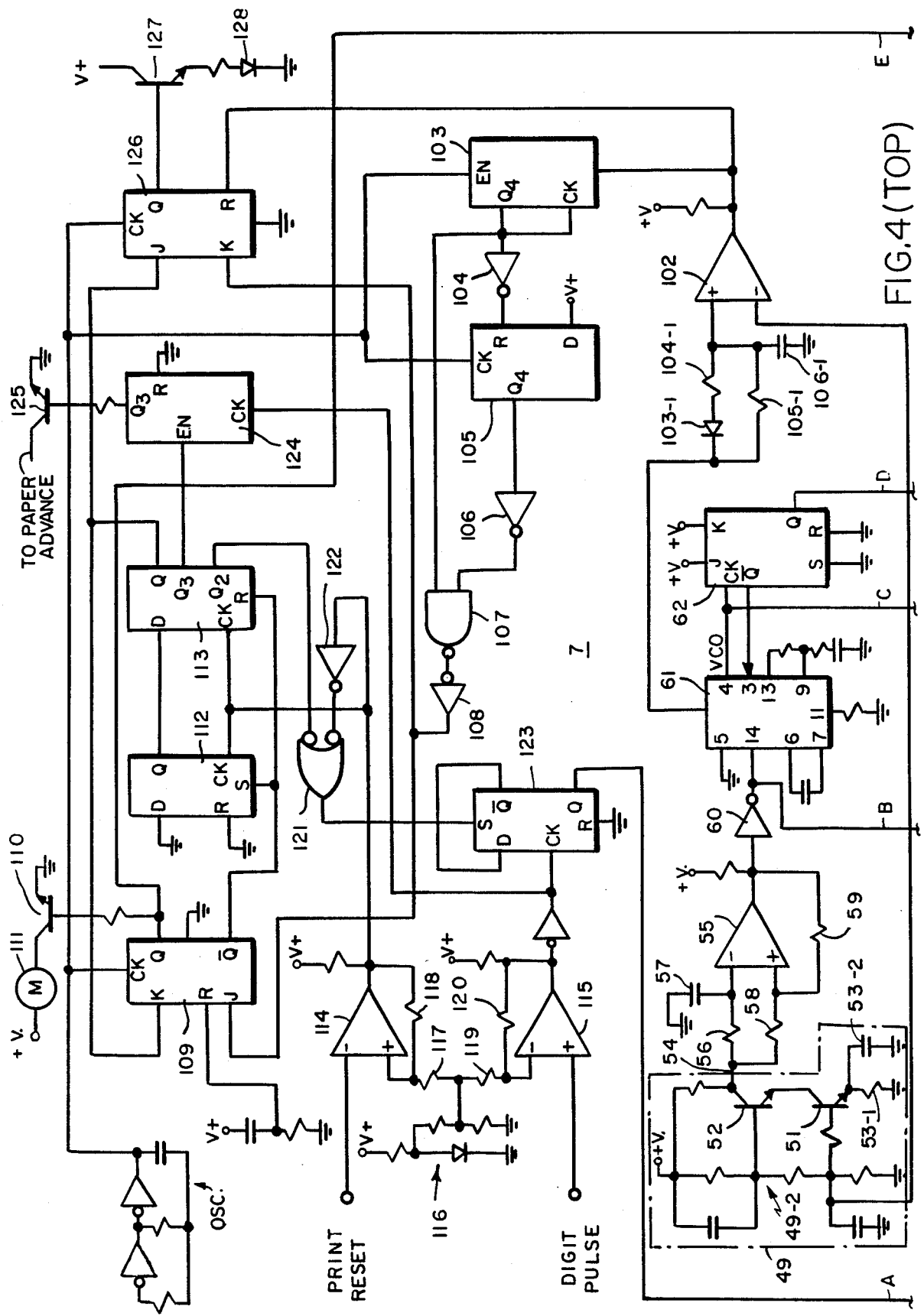
FIG. 4 (TOP)

TOTALIZER SYSTEM

BACKGROUND OF THE DISCLOSURE

Coin operated vending machines have been widely utilized for many years. Soft drinks (soda or fruit juice drinks) in cans, bottles, etc., are commonly dispersed from vending machines as are other edibles and in many cases non-edibles e.g., cosmetics, games, etc.

To operate the vending machine coins are normally inserted in the machine and a button is depressed to select the item desired.

Collection procedures commonly utilized in the vending machine industry call for a collector to visit each vending machine on a periodic basis to refil the machine as well as to collect the money in the machine.

While collection of the proceeds should supposedly directly relate to the amount of money taken in by the machine, in fact pilferage or machine malfunction may yield less cash to the machine owner. Accordingly, a need has developed to provide an up to date record of the cash collected by each vending machine so as to detect pilferage or machine malfunction as well as to reduce accounting time.

In particular there has developed the need for a portable device working in conjunction with a recording device on the vending machine, which could be used by the machine owner to interrogate each vending machine independent of the collection of the proceeds from the vending machine. The present invention provides a system which will fulfill the above requirements.

BRIEF DESCRIPTION OF THE DISCLOSURE

This invention discloses a totalizer system particularly suited for use with a single price vending machine such as those which dispense edibles e.g., soft drinks, as well as non-edibles. However, it should be understood that this system or portions thereof have wider application and accordingly it is intended that the invention not be limited to its preferred use, i.e., the dispensing of soft drinks.

The present invention replaces mechanical counters which are presently used with an interrogatable totalizer device which will provide data representing the number of vends made by the machine. The memory utilized with each machine is preferably non-resettable and will retain the data even in the event the machine is disconnected from its normal power source (e.g., 110 V AC).

The memory is interrogated or readout in the preferred embodiment by a printer or other device if desired which is capable of performing this function. In the preferred embodiment the output data from each totalizer device coupled to each vending machine is available from a light emitting device e.g., a light emitting diode whose light output is modulated by the data collected.

The diode is interrogated by a light detector which converts the data transmitted as a unique code to a printout representative of the number of vends. The light emitting diode as used in this invention appears as a pilot light and although its light output is constantly changing as data is continuously being fedout, it appears as a non-flickering light to the human eye because of the rate the data is being transmitted.

The preferred readout device (printer) of this disclosure prints the total and identifying number for each vending machine directly on cash register tape. The present invention is capable of being used for recording vends made by single price vending machines such as those currently manufactured by CHOICE VEND INC. of Windsor Locks, Conn., ROCK-OLA Inc. of Chicago, Ill., ROWE INTERNATIONAL, Whippany, N.J. and the VENDS COMPANY, St. Louis, Mo.

In this application a vend is considered as being complete (made) when adequate credit has been established in the vending machine since with the single price vending machines for which this system is particularly well suited there is no provision for the return of money. Thus while the determination of a vend may not in fact be accurate if nothing is dispensed since; the principle purpose of the system is to record money taken in the information is considered as a completed vend. However, it should be understood that in other machines, a vend may be detected with optical, electronic or mechanical sensors sensing the dispensing of goods or by sensing the operation of other devices e.g., devices releasing the items to be dispensed. Accordingly, this invention is intended to cover the determination of the number of vends no matter how the vend is actually determined to have occurred and whatever information is determined to be necessary to indicate a vend based on the type of vending machine is identified, or is considered as being completed i.e., the determination of what is actually to be considered a vend will vary according to ground rules.

In addition, the number of vends may be in code representing dollars, numbers, or anything else desired and is collectively identified as the number of vends.

BRIEF DESCRIPTION OF THE DRAWINGS

FIG. 1 is a block diagram of the totalizer system;

FIGS. 3A and 3B represent the data code used to indicate 0 and 1 bits respectively in this system;

FIG. 4 (top and bottom) joined together where shown with lines A to A, B to B, C to C, D to D and E to E (of the top and bottom) respectively reading from left to right is a schematic diagram of the readout device of this invention;

Figure 2:
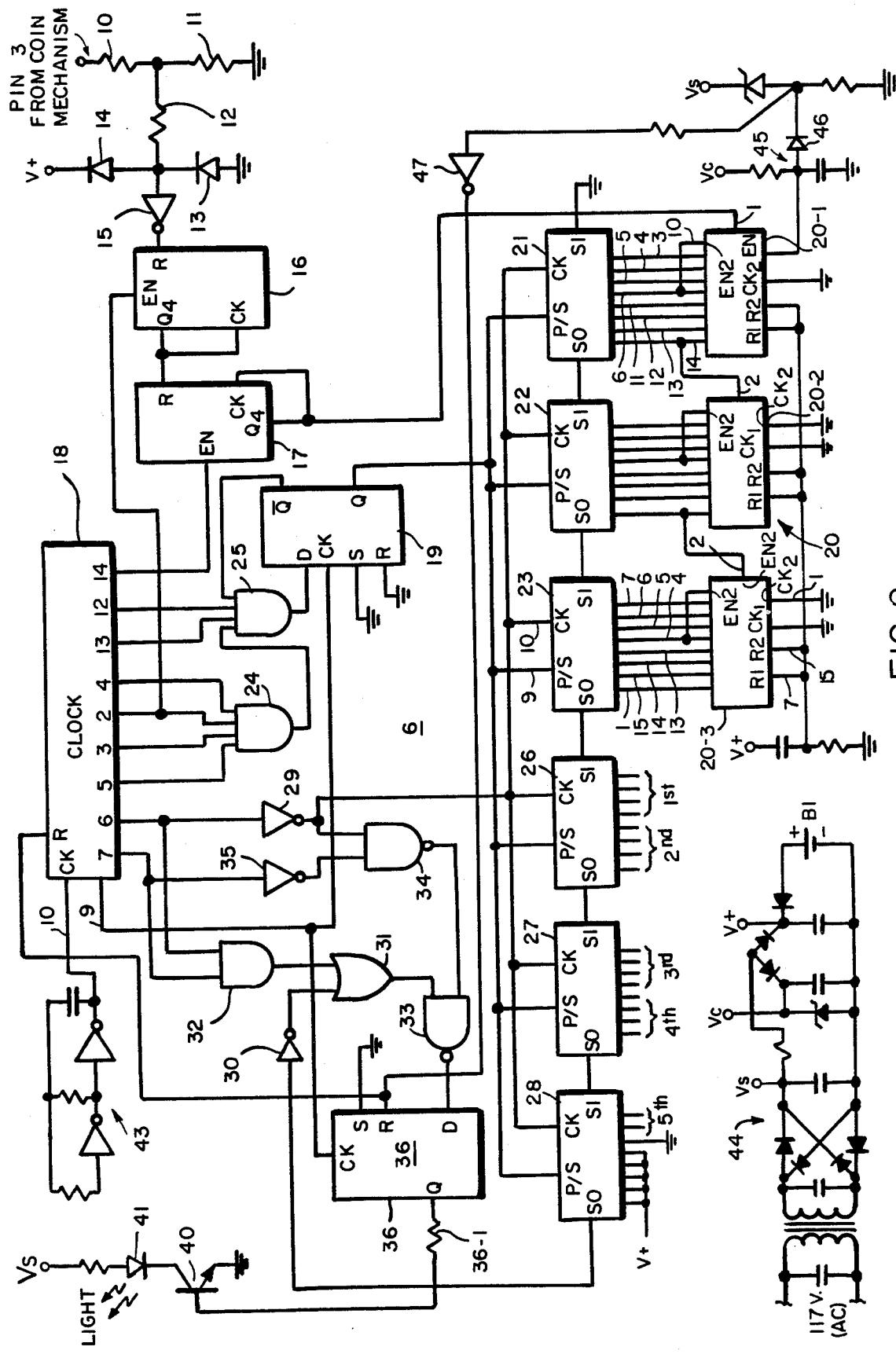
FIG. 2 is a schematic diagram of the totalizer device coupled to each vending machine.

References should now be had to FIG. 1 which discloses in block form the preferred embodiment of the disclosure. A typical single price vending machine, such as a CHOICE VEND, INC. MACHINE—Model No. CV224 (canned soda vending machine) is shown at 5. Coupled to vending machine 5 is a totalizer device 6 for detecting vends, storing the number of vends, developing a modulation signal comprising a code identifying the totalizer device and thus the vending machine to which it is coupled and a coded output relating to the number of stored vends.

In addition the totalizer 6 includes a light emitting diode 41 whose output light is modulated in accordance with the modulation signal to generate a modulated output signal indicative of the number of vends and the identification of the vending machine.

The modulated light emitted or transmitted from the totalizer device 6 is detected by a probe 49 having an outer shell or casing 49-1 e.g., of plastic and supporting a light detector 51. The probe is moved into proximity e.g., $\frac{1}{4}$" from the light source 41 so that a light detector e.g., a photo transistor 51 may intercept the light being transmitted from source 41.

An amplifier 49-2 is provided for developing a signal for providing to readout logic 7 which in turn controls the operation of a printer as will be described. It should be understood that in place of the printer and the readout logic therefore, magnetic recording (e.g., cassette) or other recording techniques may be used.

Reference should now be had to FIG. 2 for a detailed description of the totalizer device according to the invention. The vend signal from a vending machine which is used for counting purposes in this totalizer system is obtained from pin #3 of the connector leading out of the coin mechanism of the vending machine (Model CV224 of CHOICE VEND INC.) which is the pin coupled to the vend relay.

The vend replay indicates that sufficient money has been inserted to obtain a vend, i.e., a product from the vending machine 5. The output signal indicating sufficient money has been inserted is a sine wave 117 volts AC (60 cps). If insufficient money has been inserted the voltage level at pin #3 is zero volts.

The input signal is divided by resistors 10 and 11 and is current limited by resistor 12 and clamped between 0 and +5 V by diodes 13 and 14. The signal is then fed to an inverter 15 and thence to a 4 bit up BCD (decade) counter e.g., SCL 4518A (SCL indicates manufactured by Solid State Scientific Inc., Montgomeryville, Pa.).

The signal will not reset counter 16 when there is an input vend signal (+117 V) present. With no input signal (OV) present, the counter 16 is continually reset since the level at Reset (R) input is high. Upon the input of R of the counter 16 going low indicating sufficient credit to vend, the counter 16 is no longer reset and is able to count.

The counter begins to count at a 1.25 KHZ rep rate clock signal since this clock signal is coupled to the enabling pin of the counter 16. If the "VEND SIGNAL" is present for at least 6.4 miliseconds, the counter 16 will count up to eight and give high output at $Q_4$.

$Q_4$ going high is also fedback to the clock input to prevent it from continuing to count. If the vend signal disappears before 6.4 miliseconds, the counter 16 is reset and no output signal appears at $Q_4$.

The purpose of the counter 16 is to suppress noise and therefore not to obtain an erroneous count in the presence of a short noise spike.

A counter 17 (the same type as counter 16) is reset by the high from $Q_4$ which causes its $Q_4$ output to go low "OV". The counter 17 is repetively reset by the $Q_4$ output of counter 16 when there is a vend signal and thus the output of 17 will stay low when there is a vend signal. When the vend signal disappears, the counter 17 counts to 8 and is clocked by the 75 $H_z$ signal from clock 18 coupled to the enable input of 17.

When the $Q_4$ output of counter 17 goes high, it is fed back to the clock input thereof to inhibit further counting. The output from $Q_4$ of counter 17 is also fed to a 6 digit BCD counter 20 comprising three dual decade counters 20-1, 20-2 and 20-3 connected together as shown.

These counters 20-1 to 20-3 as connected will count up to 999999 vends. Thus each time a vend signal appears the counter 20 will be in incremented. The output pins of each of the counters 20-1 to 20-3 are numbered the same as shown above counter 20-1. These counters 20-1 to 20-3 also may comprise SCL4518 counters.

In order to provide the information (data) stored in counter 20 for readout purposes, there is provided three eight bit shift registers 21, 22 and 23 which are coupled to the pins numbered as shown with reference to the inputs of register 23 to parallel load the shift registers 21 to 23 with the contents of the counter 20. In particular the input pins 1, 15, 14, 13, 4, 5, 6, and 7 of each register 21 to 23 are coupled in sequence (left to right of FIG. 2) to the inputs 14, 13, 12, 11, 6, 5, 4 and 3 of the counter 20.

Loading is accomplished by a load pulse to the P/S (parallel/serial) inputs of registers 21-23 which is provided from a data flip/flop 19. The flip/flop 19 produces said load pulse at the Q output when the clock inputs from clock 18 coupled to it all go high through AND gates 24 and 25, coupled to the data input and the 40 KC clock pulse (pin 9 of 18) appears at the CK input of 19. This causes the data in counter 20 to be transferred in parallel into shift registers 21 to 23.

At 26, 27 and 28 there are provided three additional shift registers also coupled to be controlled by the load pulse from flip/flop 19. Shift registers 26, 27 and a portion of shift register 28 is used for providing a code representing the serial numbers of the totalizer device 6. In this manner a particular totalizer device 6 is associated to a vending machine which it is monitoring. This is accomplished by either connecting the parallel inputs thereof to ground or V+ to set the identifier code. With this technique a serial number of up to 39999 can be obtained with the number of inputs available.

In addition the first five inputs of shift register 28, as in the drawing, are coupled to V+ in order to generate synchronizing pulses as will be later explained. Once the data is stored in the registers 21 to 23 the information i.e., the sync bits, serial number bits and the vend count bits are serially shifted out of the shift registers 21-23 and 26 to 28 by clock pulses from inverter 29 coupled to the 10 KC output of the clock 18 (pin 6).

The information or signal is parallel loaded into the registers after every 64 clock pulses whereas the information is serially readout of the shift registers by 48 consecutive clock pulses. Each of the shift registers may conveniently be an SCL 4014.

The information shifted out is coupled to an inverter 30 and to one input of an "OR" gate 31. The other input of "OR" gate 31 is coupled to an AND gate 32 which is driven by two outputs [pin 7 (20 $KH_z$) and pin 6 (10 $KH_z$)] from the clock 18. The output of gate 31 is coupled to NAND gate 33 which is also coupled to NAND gate 34 driven by invertors 29 and 35 from clock 18.

The output from the NAND gate 33 is coupled to the data input of data flip/flop 36. The devices 29-36 combine to generate the waveform shown in FIG. 3A for a "0" bit and the waveform shown in FIG. 3B for a "1" bit. This is accomplished by the following occurring.

If both pins 7 and 6 of clock 18 are both high the output gates 35, and 39 will be low, and gate 32 will be high making gate 31 and gate 34 outputs high thus making gate output 33 low. This is represented by the period $T_1$ in FIGS. 3A and 3B. At the next clock pulse pins 6 and 7 of clock 18 will both be low, making gate 35 and 29 outputs high. This makes gate 34 output low, making gate 33 output high. This provides the period $T_2$ in FIGS. 3A and 3B. When pins 6, and 7 are different during periods $T_3$ and $T_4$ gate 34 output will be high and gate 32 will be low enabling the output of shift register 28 to be gated through to the output of gate 33 (see FIGS. 3A and 3B).

The output of NAND gate 33 therefore is the same as the output of the shift register 28. Thus if the output of shift register is low "0", then the waveform will be as in FIG. 3A during $T_3$ and $T_4$ and if the output of the shift register 28 is high during $T_3$ and $T_4$, the output waveform will be as in FIG. 3B.

The reason for developing the two different waveforms in FIGS. 3A-3B is to represent "0" and "1" bits to provide for reliable data transmission and decoding since these types of waveforms are always similar i.e., during periods $T_1$ and $T_2$ to allow for the use of the signal during $T_1$ and $T_2$ for synchronization purposes no matter if the information be a "0" or "1". Therefore a suitable phase lock loop may be used to lock into the $T_1$ to $T_2$ transistion for establishing clocking to read the data based on fixed position clock pulses relative to the information contained in $T_3$ and $T_4$.

Therefore with this system no separate output clock line is needed since the clock is developed from the output signal. The output from flip/flop 36 is applied to driver transistor 40 which has an LED 41 coupled to its collector. The pulses (FIGS. 3A and 3B) are fed into transistor 40 and causes the light output of the LED 41 to be modulated i.e., turned on when the input signal is high, and off when the input signal is low.

The clock signal input is derived from a conventional oscillator shown at 43 providing an 80 KHZ signal to clock 18 comprising a 12 state ripple carry binary counter-divider such as an SCL 4040A. The numbers 10, 9, 7, 6, 5, 3, 2, 4, 13, 12 and 14 (left to right in FIG. 2) associated with clock 18 represent the respective output pins from the SCL 4040A to generate the required timing signals previously described. The frequencies are in decreasing orders of 2 reading from left to right beginning with pin 10 with the input frequency at pin 10 being selected as 80 KHZ.

The totalizer device 6 preferably has a power supply generally shown at 44 which has a battery $B_1$ to power some of the circuitry so that a running total of vends can be maintained even when the vending machine is unplugged. The circuitry used in the totalizer device 6 is inherently low in power drain, however the power dissipated is proportional to the frequency at which the logic is operated. The key to the long battery life of this supply 44 is the fact that the clock 18 is shut down during battery operation. This results in the remaining circuitry being completely static; their frequency of operation is zero.

To accomplish this there are two regulated supplies Vc and V+. Vc is maintained at approximately 5 volts only when external power is provided to the totalizer device. V+ is maintained at 5 volts when the totalizer is externally powered and drops to 4.4 volts, a value maintained by the battery when no external power is supplied. Most of the integrated circuits in the device 6 are powered from V+ however the clock 18 as well as preferably several other devices not associated with data storage are supplied from Vc. Vs is an unregulated supply used to power the diode 41 for the readout. Heavy currents drawn by the diode 41 make it undesirable to power it from the Vc or V+ regulated supplied.

It is important that no transients due to external power being applied to the totalizer device cause it to register false vends. An RC circuit 45 with a 10 MΩ and 0.1 μF capacitor powered from Vc disables the counter under no external power and power up conditions. A special advance warning circuit is employed at power down. As the voltage at Vs first starts to decay upon removal of external power the previously mentioned reset circuit is reset through diode 46.

A signal is also created at the input to inverter 47 the output of which resets flip/flop 36 and clock 18. Flip/flop 36 is powered by V+ therefore it is never power down. The output of flip/flop 36 drives transistor 40 through a 10K resistor 36-1. Thus flip/flop 36 is always powered. When there is no external power to the totalizer it is undesirable for the output of flip/flop 36 to be high as this would result in significant battery drain through the 10K resistor 36-1 connected to its output.

By resetting flip/flop 36 and clock 18, which clocks flip/flop 36 just prior to power down, with a signal from inverter 47, it can be assured that the output of flip/flop 36 will never be in the high state when no external power is supplied to the totalizer.

The power drain from this circuit as previously mentioned is extremely low during standby, so that the battery B1 which supplies the power is essentially open circuited. Many batteries have a shelf life problem, that is the energy stored in the battery decreases with time, even though the battery is unconnected. Mercury batteries have a shelf life of approximately 1 year, lithium batteries 5-10 years, and so called solid state batteries in excess of 10 years.

Solid State batteries have a very large source resistance that is, not very much current can be supplied by the battery. The extremely low current drain of this totalizer device 6 makes it possible to use these batteries and take advantage of their extremely long shelf life. The batteries can therefore be manufactured into the totalizer device 6 just as any other component and need never be replaced, or for that matter, a customer need never know they exist.

While the supply 44 shown is preferred it should be understood that conventional power supplies may be used in lieu of the supply 44. Reference should now be had to FIG. 4 which illustrates a readout device comprising probe 49, logic 7 and printer 8 for the totalizer device 6 of FIG. 2. The information from the totalizer device 6 in the form of light pulses provided by LED 41 is picked up by a photo transistor 51. The transistor 51 is connected to a transistor 52.

Transistor 52 provides a constant voltage at the collector of 51 thereby speeding the response of transistor 51 to changes in light. These transistors 51 and 52 are coupled together in a conventional cascode configuration well known in the art for this purpose. Bias is provided for the transistors 51 and 52 by the resistor divider network as shown.

Bypass capacitors are provided in the bias divider network to prevent feedback of higher frequencies caused by the input signal thereby providing a constant DC bias. Emitter degeneration is provided for transistor 51 by a resistor 53-1 and capacitor 53-2 which are selected to optimize gain at high frequencies 80 KHZ (the frequency of input signal from 41), and to prevent erroneous signals at lower frequencies from ambient light sources e.g., fluorescent lights from causing erroneous input information.

The resistor 53-1 directly effects the current passing through transistor 51 at low frequencies whereas the capacitor 53-2 bypasses the current at high frequencies and thus prevents the current in transistor 51 from being limited by resistor 53-1, e.g., with a Monsanto Photo Transistor No. MT2, as 51, the resistance 53-1 would be 1 K ohms and the capacitor would be 33 mf.

The output from transistor 52 is fed through a cable 54 to a comparator 55 which provides an output signal representative of turning on and off of the LED 41. In particular the input of camparator 55 is connected to an RC filter (resistor 56 and capacitor 57) which together provide a reference signal proportional to the average signal level from the output of transistor 52.

The + input of comparator 55 is fed through an input resistor 58 and positive feedback is provided by resistor 59. The resistors 58 and 59 combined provide for a sharp turn on. The output from comparitor 55 is inverted by invertor 60 and is applied to an input of a phase lock loop system comprising a phase lock loop device 61 and a JK flip/flop 62.

The phase lock loop locks to the $T_1$, $T_2$ positive edge transistions (see FIGS. 3A and 3B) as is well known in the art. The flip/flop 62 combines with phase lock loop 61 to provide an output signal VCO at pin 4 which is twice the data rate if the rate of $\overline{Q}$ of 62 is the input signal rate. This is a standard technique well known in the art (see RCA COS/MOS integrated circuits 1975 Data Book Series 1974 by RCA Corporation page 471–478 and in particular page 477.

The Q output from flip/flop 62 is at the data rate and is used to clock in data information into a 12 stage shift, each stage comprising 4 bit registers 71–82 as shown. The data or input signal (information) is provided to the D input of the first stage 71. The output of the last two stages 81 and 82 are connected to two AND gates 83 and 84 as shown to generate an output when five consecutive "1" data bits are detected indicating properly synchronized data are in the 12 stage shift register.

This is so because 5 "1" data synchronization bits are transmitted by the totalizer only once per stream of data as previously mentioned. The output of gate 83 is applied to flip/flop 85 J input to set the flip/flop 85 when this condition occurs. The high speed clock (2×data rate) from 61 is applied through an inverter 86 to clock in this condition so that valid data can be detected and preserved before new data is shifted into the 12 stage shift register (71–82). The output of flip/flop 85 loads the data from the 12 stage shift register into counters 91 to 101. If five "1" bits are not detected no data is loaded into counters 91–101.

Thus the five "1"—s in a row indicate that a block of data is present corresponding to data in the totalizer which was transmitted by LED 41. The readout system logic 7 also includes a phase lock detector comprising comparator 102 and input components diode 103-1, resistor 104-1, resistor 105-1 and capacitor 106-1. The detector determines if phase pulses are present because if so this indicates that device 61 is not locked on to an input signal. The detector accomplishes this by the network 103-1-106-1 acting as a peak detector and low pass filter thereby providing a low input signal if phase pulses are present and high voltage signal if pulses are not present or if only narrow pulses are present.

The output from comparator 102 is used to initiate a time delay implimented by a four stage counter 103, inverter 104 and a four stage shift register 105 to provide sufficient delay for data to be stored in the counters 91–101 prior to causing the printer to print. Time delay alternately may be provided using a monostable e.g., SCL4528. Inverter 106, NAND gate 107 and inverter 108 combine with the outputs provided from shift register 105 and counter 103 to generate an output signal only once every time the phase lock loop locks on to an input signal thus causing printing to occur once for each time the photo transistor 51 is moved in position to read the output from LED 41.

The counter 103 is reset when the phase lock loop is not in lock and is enabled to count to 8 when the phase lock loop 61 acquires lock. The four stage shift register 105 is enabled to clock when counter 103 has counted to 8. The shift register 105, $Q_4$ output goes high four clock pulses after it has been clocked. The simultaneous high output 103 and 105 cause gate 107 output to go low which is then inverted by inverter 108 to provide a high output signal.

This high output signal is used to set JK flip/flop 109 which controls the printer motor 111 through transistor 110. The output of 109 also reset flip/flop 85 thereby preventing any further data from being entered into counters 91–101 to prevent the data in the counters from changing until readout. The $\overline{Q}$ output of flip/flop 109 goes low and is used to enable D flip/flop 112 and four stage shift register 113.

Since at this time the motor is turning (since Q 109 is high thereby turning on transistor 110) PRINT RESET and DIGIT PULSE is provided by the printer 8 itself. The RESET pulse represents the print drum on the printer making one revolution. Two DIGIT PULSE's are provided by the printer for each character of the print drum. One, as the print drum character (1, 2, etc.,) comes into place for printing and second when it moves out of position for printing.

The pulses are continuously provided as the print drum rotates. The pulses are shaped by comparators 114 and 115 respectively, to convert the low level signal to high level square waves suitable to drive the remainder of the printer logic. Resistor-diode network 116 provides a 0.3 volt reference signal into the comparators. Resistors 117 and 118 are used to provide hystereses for comparator 114 and resistors 119 and 120 are used to provide hysteresis for comparator 115.

Thus in effect the comparators 114 and 115 connected as shown each function as a Schmitt trigger. The output from 114 is used to clock data flip/flop 112 and shift register 113 to cause the high output at Q of 112 to be loaded into shift register 113 and shifted sequenctially through stage 113 once each reset pulse (i.e., for each rotation of the printer drum).

During the first rotation of the printer drum after flip/flop 109 is set the printer drum comes up to speed. During the second rotation of the print drum the data in counter 91–101 is printed on paper by $Q_2$ of shift register 113 going high after the first revolution of the printer drum.

The $Q_2$ output is NANDed in gate 121 with the reset signal inverted by inverter 122. The output of gate 121 is used to enable data flip/flop 123. Digit pulses (26 per revolution of the print drum) then cause flip/flop 123 to toggle and provide clock signals to counters 91–101.

When the carry out (CO) output of any counter is low and the Q output of flip/flop 123 is low the output of the respective NOR gates 91-1 to 101-1 associated with the counters 91–101 as shown will go high to cause drive transistors 91-2 to 101-2 to turn on to energize the print hammer solenoid (PH) thereby pulling in the respective print hammer, causing the character in the counter to be printed. The collectors of each of transistors 91-2 to 101-2 are connected to the print hammer solenoid of the printer 8.

The counters are advanced by clock pulses from flip/flop 123 which occur once for every character in a column of the drum. For example, if the counter 91 is loaded with a 5, as the characters 0–4 on print wheel (there are 16 print wheels each having 13 characters forming the drum) come into position the counter 91 will count towards 0 but no printing will take place. As the sixth character, a "5" comes into place the counter output (CO) will go low causing the hammer to force the paper against the character 5 on the print wheel.

On the next revolution of the print drum output $Q_3$ of shift register 113 will go high enabling four bit counter 124 to count. When it has clocked four digit pulses, $Q_3$ from counter 124 goes high and causes driver transistor 125 to advance the paper one line. After another revolution of the print drum during which time paper is being advanced, $Q_4$ of shift register 113 goes high resetting flip/flop 109 which turns off the printer motor.

$Q_4$ also at this time causes indicator mechanism JK flip/flop 126 to be set thereby turning transistor 127 on causing LED 128 to turn on indicating data has been printed and that the operator may move on to another machine to read out data. When the phase lock loop loses lock (when operator moves photo transistor 51 away from LED 41) flip/flop 126 is reset. In place of the LED a buzzer or an audible device may be used if desired.

Thus systems data is read out if lock is achieved even if the operator moves the transistor 51 away from LED 41 before the printer has completed the printing operation. In this readout device of FIG. 4 the stages of the shift register are coupled as shown to each other i.e., stages 71 and 72, 73 and 74, 75 and 76, 77 and 78, 79 and 80, and 81 and 82 are paired with the pair connected as shown.

Each shift register stage of the pair may comprise a SCL 4015 (½ for each stage), SCL denoting the manufacturer Solid State Scientific, Inc. The shift register stages 71-81 are interconnected to counters e.g., and SCL 4029, as shown, for example, by the interconnection of pins, 5, 4, 3 and 10 of shift register stage 71 to the A, B, C and D inputs of counter 91 and shift register 72 pins 13, 12, 11 and 2 to the A, B, C and D inputs respectively of counter 92. The connectors are the same for all shift register pairs to the respective counters as disclosed with reference to stages 71, 72 and counters 91 and 92.

The phase lock device may be a SCL 4046 B sold by Solid State Scientific, Inc. The printer 9 is preferably a model MP-11 shold by the STAR MANUFACTURING CO. Shizuoka, Japan. It should also be understood that magnetic recording may be used in lieu of printing as shown herein.

I claim:

1. A totalizer transmitter for being fixedly coupled to a money operated machine for making sales, said transmitter providing a light output signal while coupled to the machine, said transmitter comprising counter means for counting data representing the number of times the machine makes a sale, a free running clock means for providing a plurality of clock signals, serial transmission means coupled to said counter, the data in said serial transmission means continuously updated from said counter in response to one of said plurality clock signals, said serial transmission means continuously providing a transmitted signal in response to another of said plurality of clock signals, said transmitted signal having an output waveform of data and clock information in a coded form in which each bit of the clock information is in the period of the output waveform and the data is the pulse width of the output waveform, and a light emitting diode coupled to said serial transmission means for transmitting light signals representing the coded output signal, whereby the transmitted signal is read out without the necessity of any external interrogation signal.

2. The transmitter of claim 1 in which said counter means is non-resettable.

3. The transmitter of claim 1 including means for providing an identifier code along with the data for transmission as part of the signal, said identifier code identifying the particular transmitter.

4. The transmitter of claim 1 in which said free running clock is disabled upon loss of power.

5. A system comprising a totalizer transmitter for being fixedly coupled to a money operated machine for making sales, said transmitter providing a light output signal while coupled to the machine, said transmitter comprising counter means for counting data representing the number of times the machine makes a sale, a free running clock means for providing a plurality of clock signals, identifier generating means, serial transmission means coupled to said counter and said identifier generating means, the data in said serial transmission means continuously updated from said counter and said identifier means in response to one of said plurality of clock signals, said serial transmission means continuously providing a transmitted signal in response to another of said plurality of clock signals, said transmitted signal having an output waveform of data and identifier code and clock information in a coded form in which each bit of the clock information is in the period of the output waveform and the data and identifier code is the pulse width of the output waveform, a light emitting diode coupled to said serial transmission means for continuously transmitting light signals representing the coded output signal, whereby the transmitted signal is read out without the necessity of any external interrogation signal, and interrogating means for positioning adjacent to said light emitting diode for converting the output waveform to information representing the amount of sales detected by the totalizer transmitter and the identification of the totalizer transmitter.

6. The transmitter of claim 5 in which said counter means is non-resettable.

7. The transmitter of claim 5 in which said free running clock is disabled upon loss of power.

8. The system of claim 5 in which the interrogating means includes a phase lock loop for locking on to the waveform provided by the transmitter.

9. The system of claim 5 in which the interrogating means including a printer.

* * * * *